(12) United States Patent
Tang et al.

(10) Patent No.: US 8,658,502 B2
(45) Date of Patent: Feb. 25, 2014

(54) METHOD FOR REDUCING MORPHOLOGICAL DIFFERENCE BETWEEN N-DOPED AND UNDOPED POLYSILICON GATES AFTER ETCHING

(71) Applicant: Shanghai Huali Microelectronics Corporation, Shanghai (CN)

(72) Inventors: Zaifeng Tang, Shanghai (CN); Yukun Lv, Shanghai (CN); Chao Fang, Shanghai (CN); HsuSheng Chang, Shanghai (CN)

(73) Assignee: Shanghai Huali Microelectronics Corporation, Shanghai (CH)

( * ) Notice: Subject to any disclaimer, the term of this patent is extended or adjusted under 35 U.S.C. 154(b) by 0 days.

(21) Appl. No.: 13/721,073

(22) Filed: Dec. 20, 2012

(65) Prior Publication Data
US 2013/0316539 A1 Nov. 28, 2013

(30) Foreign Application Priority Data

May 22, 2012 (CN) .......................... 2012 1 0163138

(51) Int. Cl.
*H01L 21/8236* (2006.01)
(52) U.S. Cl.
USPC ............................ 438/275; 438/587; 438/588
(58) Field of Classification Search
USPC .................. 438/154, 199, 275, 286, 587, 588
See application file for complete search history.

(56) References Cited

U.S. PATENT DOCUMENTS

| | | | |
|---|---|---|---|
| 5,963,568 A * | 10/1999 | Paoli | 372/23 |
| 6,813,290 B1 * | 11/2004 | Fukuhisa | 372/43.01 |
| 7,888,197 B2 * | 2/2011 | Chidambarrao et al. | 438/221 |
| 8,569,159 B2 * | 10/2013 | Cheng | 438/585 |
| 2007/0096195 A1 * | 5/2007 | Hoentschel et al. | 257/315 |
| 2007/0128783 A1 * | 6/2007 | Ting et al. | 438/199 |
| 2008/0080580 A1 * | 4/2008 | Takayama et al. | 372/45.011 |
| 2009/0035903 A1 * | 2/2009 | Oh et al. | 438/261 |

* cited by examiner

*Primary Examiner* — Kevin M Picardat
(74) *Attorney, Agent, or Firm* — Anova Law Group, PLLC

(57) ABSTRACT

The present invention discloses a method for reducing the morphological difference between N-doped and undoped poly-silicon gates after etching, comprising the following sequential steps: depositing a hard mask layer on a substrate template having N-doped poly-silicon and undoped poly-silicon to form an N-doped poly-silicon hard mask layer and an undoped poly-silicon hard mask layer respectively, and etching the undoped poly-silicon hard mask layer to make a thickness difference between the N-doped poly-silicon hard mask layer and the undoped poly-silicon hard mask layer; depositing an anti-reflection layer, and etching according to a predetermined pattern until exposing the N-doped poly-silicon, wherein when the N-doped poly-silicon is exposed, the undoped poly-silicon is etched to a certain degree; and removing residuals on the surface of the above formed structure, and etching to form an N-doped poly-silicon gate and an undoped poly-silicon gate, respectively.

4 Claims, 3 Drawing Sheets

METHOD FOR REDUCING MORPHOLOGICAL DIFFERENCE BETWEEN N-DOPED AND UNDOPED POLYSILICON GATES AFTER ETCHING

CROSS-REFERENCE TO RELATED APPLICATION

This application claims the priority benefit of China application serial no. 201210163138.4, filed May 22, 2012. All disclosure of the China application is incorporated herein by reference.

FIELD OF THE INVENTION

The present invention relates to the field of microelectronic technology, and particularly to a method for improving the morphological difference between N-doped and undoped poly-silicon gates after etching.

BACKGROUND OF THE INVENTION

In the technology with a critical dimension of 65 nm or less, it is generally required that a poly-silicon gate in the device should be composed of N-doped poly-silicon and undoped poly-silicon. Due to the effect of N-type ion doping, the etching rate of the N-doped poly-silicon is larger than that of the undoped poly-silicon.

In an automatic end point detection system, the basis for determining the termination of the poly-silicon gate etching is that both the N-doped and undoped poly-silicon gates are completely etched. In case that the etching of the N-doped poly-silicon gate is completed in advance due to its relatively larger etching rate, and the plasma bombardment is still performed in order to etch the undoped poly-silicon gate, the bottom of the N-doped poly-silicon gate will be damaged, thus developing an under-cut. In this process condition, there will be a difference between the N-type and P-type semiconductor devices, which may influence the overall performance of the final product.

The etching process for the 65 nm and 55 nm scale poly-silicon gate commonly comprises the following steps. Step 1: after growing poly-silicon composed of N-doped poly-silicon and undoped poly-silicon, forming a hard mask layer on the poly-silicon serving as an etching blocking layer and depositing an anti-reflection layer subsequently. Step 2: coating a photoresist and applying photolithography to form a patterned photoresist layer for the poly-silicon gate etching. Step 3: starting the etching process by etching the anti-reflection layer firstly using the patterned photoresist layer as a mask. Step 4: etching the hard mask layer. Step 5: removing the patterned photoresist layer in the etching machine. Step 6: etching the poly-silicon to from a poly-silicon gate. During the etching process for forming the poly-silicon gate, since the etching rate of the N-doped poly-silicon is larger than that of the undoped poly-silicon, a morphological difference will develop between them.

SUMMARY OF THE INVENTION

The present invention provides a method for improving morphological difference between the N-doped and undoped poly-silicon gates after etching, namely, a method which eliminates the morphological difference between the N-doped poly-silicon gate and the undoped poly-silicon gate after etching due to the larger etching rate of the N-doped poly-silicon than that of the undoped poly-silicon, by forming a relatively thick hard mask layer on the N-doped poly-silicon.

In order to achieve the above object, the present invention provides a method for reducing the morphological difference between the N-doped and undoped poly-silicon gates after etching comprising the following sequential steps:

Step 1: depositing a hard mask layer on a substrate template having N-doped poly-silicon and undoped poly-silicon to form an N-doped poly-silicon hard mask layer and an undoped poly-silicon hard mask layer respectively, and etching the undoped poly-silicon hard mask layer to make a thickness difference between the N-doped poly-silicon hard mask layer and the undoped poly-silicon hard mask layer; the thickness of the undoped poly-silicon hard mask layer is etched to be less than that of the N-doped poly-silicon hard mask layer;

Step 2: depositing an anti-reflection layer on the N-doped poly-silicon hard mask layer and the undoped poly-silicon hard mask layer with different thicknesses, and etching according to a predetermined pattern until exposing the N-doped poly-silicon, wherein when the N-doped poly-silicon is exposed, the undoped poly-silicon is etched to a certain degree;

Step 3: removing residuals formed during etching on the surface of the above structure formed by Step 2, and etching the N-doped poly-silicon and undoped poly-silicon to form an N-doped poly-silicon gate and an undoped poly-silicon gate, respectively.

In a preferred embodiment of the present invention, wherein the thickness difference between the undoped poly-silicon hard mask layer and the N-doped poly-silicon hard mask layer in the Step 1 is related to the etching rate ratio of the hard mask layer and the undoped poly-silicon in the Step 2, as well as the etching rate ratio of the undoped poly-silicon and N-doped poly-silicon in the Step 3.

In a preferred embodiment of the present invention, wherein the thickness difference between the undoped poly-silicon hard mask layer and the N-doped poly-silicon hard mask layer in the Step 1 is calculated according to the following equation:

$$T_{HM\_Ppoly} = \frac{ER_{HM\_HM}}{ER_{Ppoly\_HM}} \times T_{Ppoly\_etch}$$

where $TH_{M\_Ppoly}$ is the thickness difference between the undoped poly-silicon hard mask layer and the N-doped poly-silicon hard mask layer in the Step 1, $ER_{HM\_HM}$ is the etching rate of the hard mask layer in the Step 2, $ER_{Ppoly\_HM}$ is the etching rate of the undoped poly-silicon in the Step 2, $T_{Ppoly\_etch}$ is the etching thickness of the undoped poly-silicon when the N-doped poly-silicon is exposed in the Step 2, and $T_{Ppoly\_etch}$ is calculated according to the following equation:

$$T_{Ppoly\_etch} = T_{Ppoly\_remain}$$

where $T_{Ppoly\_remain}$ is the remaining thickness of the undoped poly-silicon when the etching of the N-doped poly-silicon gate is complete in the conventional technology, and $T_{Ppoly\_remain}$ is calculated according to the following equation:

$$T_{Ppoly\_remain} = T_{poly} - \frac{ER_{Ppoly\_poly}}{ER_{Npoly\_poly}} \times T_{poly}$$

where $T_{poly}$ is the total thickness of the N-doped and undoped poly-silicon, $ER_{Ppoly\_poly}$ is the etching rate of the undoped poly-silicon, and $ER_{Npoly\_poly}$ is the etching rate of the N-doped poly-silicon.

In a preferred embodiment of the present invention, the etching time for etching the undoped poly-silicon hard mask layer is calculated according to the following equation:

$$Time_{HM\_etch} = \frac{T_{HM\_Ppoly}}{ER_{HM\_HM}},$$

where $Time_{HM\_etch}$ is the etching time for etching the undoped poly-silicon hard mask layer in the Step 1, $ER_{HM\_HM}$ is the etching rate of the hard mask layer in the Step 1, $T_{HM\_Ppoly}$ is the thickness difference between the undoped poly-silicon hard mask layer and the N-doped poly-silicon hard mask layer in the Step 1, and $T_{HM\_Ppoly}$ is calculated according to the following equation:

$$T_{HM\_Ppoly} = \frac{ER_{HM\_HM}}{ER_{Ppoly\_HM}} \times T_{Ppoly\_etch},$$

where $T_{HM\_Ppoly}$ is the thickness difference between the undoped poly-silicon hard mask layer and the N-doped poly-silicon hard mask layer in the Step 1, $ER_{HM\_HM}$ is the etching rate of the hard mask layer in the Step 2, $ER_{Ppoly\_HM}$ is the etching rate of the undoped poly-silicon in the Step 2, $T_{Ppoly\_etch}$ is the etching thickness of the undoped poly-silicon when the N-doped poly-silicon is exposed in the Step 2, and $T_{Ppoly\_etch}$ is calculated according to the following equation:

$$T_{Ppoly\_etch} = T_{Ppoly\_remain},$$

where $T_{Ppoly\_remain}$ is the remaining thickness of the undoped poly-silicon when the etching of the N-doped poly-silicon gate is complete in the conventional technology, and $T_{Ppoly\_remain}$ is calculated according to the following equation:

$$T_{Ppoly\_remain} = T_{poly} - \frac{ER_{Ppoly\_poly}}{ER_{Npoly\_poly}} \times T_{poly}$$

where $T_{poly}$ is the total thickness of the N-doped and undoped poly-silicon, $ER_{Ppoly\_poly}$ is the etching rate of the undoped poly-silicon, and $ER_{Npoly\_poly}$ is the etching rate of the N-doped poly-silicon.

The method of the present invention can effectively improve the morphological difference between the N-doped and undoped poly-silicon gates after etching.

DETAILED DESCRIPTION OF THE EMBODIMENTS

The present invention provides a method for improving morphological difference between the N-doped and undoped poly-silicon gates after etching, namely, a method which eliminates the morphological difference between the N-doped and undoped poly-silicon gates after etching due to the larger etching rate of N-doped poly-silicon than that of undoped poly-silicon, by forming a relatively thick hard mask layer on the N-doped poly-silicon gate.

The present invention will be described in further details hereinafter by referring to embodiments thereof, so as to provide a better understanding of the present invention. However, these embodiments do no intend to limit the scope of the present invention.

Figure 1:
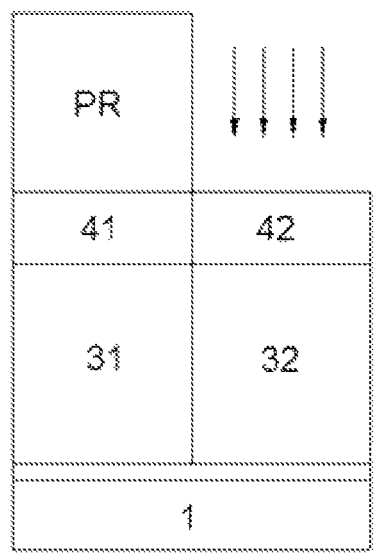
FIG. 1 is a structural diagram illustrating etching of an undoped poly-silicon hard mask layer in an embodiment of the present invention.
Figure 2:
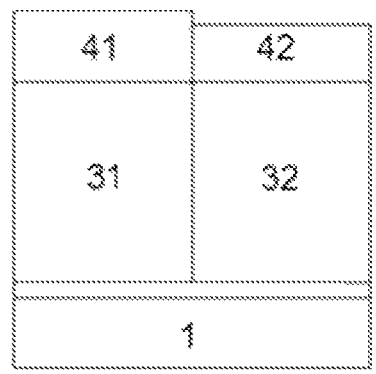
FIG. 2 is a diagram illustrating the structure in which silicon hard mask layers with different thicknesses have been formed in an embodiment of the present invention.

As shown in FIG. 1, a hard mask layer is deposited on a substrate template 1 comprising N-doped poly-silicon 31 and undoped poly-silicon 32 to form an N-doped poly-silicon hard mask layer 41 and an undoped poly-silicon hard mask layer 42, respectively, and the undoped poly-silicon hard mask layer 42 is etched so as to have a thickness less than that of the N-doped poly-silicon hard mask layer 41. The etching of the undoped poly-silicon hard mask layer 42 can be performed by using a patterned photoresist PR as a mask. The resulting structure is shown in FIG. 2.

Figure 3:
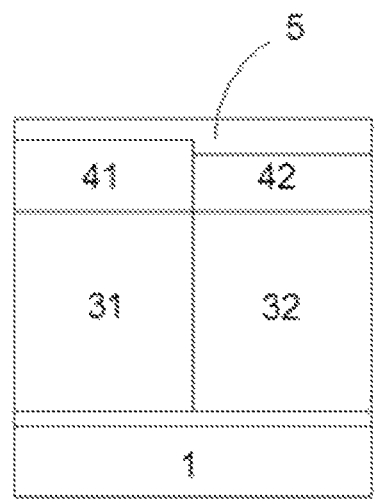
FIG. 3 is a diagram illustrating the structure in which an anti-reflection layer has been deposited in an embodiment of the present invention.
Figure 4:
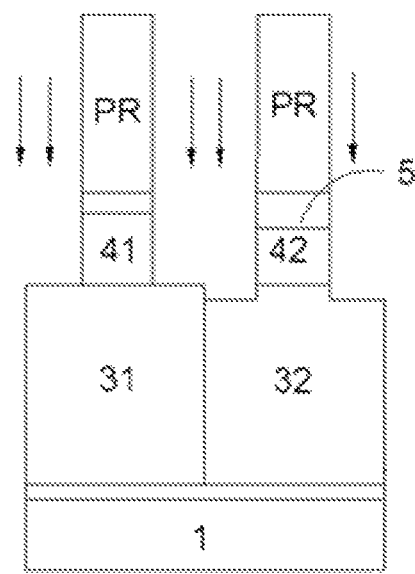
FIG. 4 is a diagram illustrating the structure in which the etching of the hard mask layer is complete in an embodiment of the present invention.

As shown in FIG. 3, an anti-reflection layer 5 is deposited on the N-doped poly-silicon hard mask layer 41 and the undoped poly-silicon hard mask layer 42 which have different thicknesses. The formed device is etched according to a predetermined pattern until the N-doped poly-silicon 31 is exposed. As shown in FIG. 4, when the N-doped poly-silicon 31 is exposed, the undoped poly-silicon 32 is etched to a certain degree.

Figure 5:
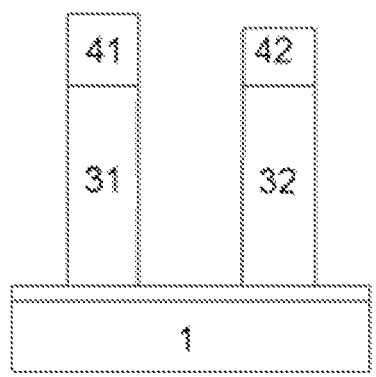
FIG. 5 is a diagram illustrating the structure in which an N-doped poly-silicon gate and an undoped poly-silicon gate have been formed in an embodiment of the present invention.

Afterwards, the residuals on the device surface during etching are removed. Then the device is etched to form an N-doped poly-silicon gate 41 and an undoped poly-silicon gate 42, as shown in FIG. 5.

In the step of etching to form the poly-silicon gates, there is a difference in etching rate between the N-doped poly-silicon 31 and the undoped poly-silicon 32. Therefore, it is necessary to determine the remaining thickness of the undoped poly-silicon to be etched when the etching of the N-doped poly-silicon gate is complete. The remaining thickness is determined according to the etching rate ratio of the undoped poly-silicon and N-doped poly-silicon. In an embodiment, the remaining thickness is calculated according to the following equation:

$$T_{Ppoly\_remain} = T_{Poly} - \frac{ER_{Ppoly\_poly}}{ER_{Npoly\_poly}} \times T_{poly} \qquad (1)$$

where $T_{Ppoly\_remain}$ is the remaining thickness of the undoped poly-silicon when the etching of the N-doped poly-silicon gate is complete in the conventional technology, $T_{poly}$ is the total thickness of the poly-silicon composed of the N-doped and undoped poly-silicon, $ER_{Ppoly\_poly}$ is the etching rate of the undoped poly-silicon, $ER_{Npoly\_poly}$ is the etching rate of the N-doped poly-silicon.

Since the remaining thickness of the undoped poly-silicon equals to the thickness of the undoped poly-silicon $T_{Ppoly\_etch}$ which is required to be etched during the etching of the hard mask layers, then $$T_{Ppoly\_etch} = T_{Ppoly\_remain} \quad (2)$$

During the step of etching the hard mask layers, the etching thickness of the hard mask layer on the undoped poly-silicon, i.e., the thickness difference between the undoped poly-silicon hard mask layer and the N-doped poly-silicon hard mask layer $T_{HM\_Ppoly}$, is determined according to the etching rate ratio of the hard mask layer and the undoped poly-silicon. In an embodiment, the thickness difference $T_{HM\_Ppoly}$ is calculated according to the following equation:

$$T_{HM\_Ppoly} = \frac{ER_{HM\_HM}}{ER_{Ppoly\_HM}} \times T_{Ppoly\_etch} \quad (3)$$

where $ER_{HM\_HM}$ is the etching rate of the hard mask layer, and $ER_{Ppoly\_HM}$ is the etching rate of the undoped poly-silicon.

From the calculated thickness difference $T_{HM\_Ppoly}$ and the etching rate of the hard mask layer $ER_{HM\_HM}$, it is possible to calculate the etching time $Time_{HM\_etch}$ for the hard mask layer located on the undoped poly-silicon. The etching time $Time_{HM\_etch}$ is calculated according to the following equation:

$$Time_{HM\_etch} = \frac{T_{HM\_Ppoly}}{ER_{HM\_HM}} \quad (4)$$

The specific embodiments of the present invention have been described as above, but the present invention is not limited to the embodiments described above, since these embodiments are only exemplary in nature. It is apparent for the skilled in the art that any equivalent modification and substitution fall within the scope of the present invention. Therefore, all equivalent modifications and substitutions without departing from the spirit and scope of the present invention should be covered by the present invention.

The invention claimed is:

1. A method for reducing the morphological difference between the N-doped and undoped poly-silicon gates after etching comprising the following sequential steps:
   Step 1: depositing a hard mask layer on a substrate template having N-doped poly-silicon and undoped poly-silicon to form an N-doped poly-silicon hard mask layer and an undoped poly-silicon hard mask layer respectively, and etching the undoped poly-silicon hard mask layer to make a thickness difference between the N-doped poly-silicon hard mask layer and the undoped poly-silicon hard mask layer; the thickness of the undoped poly-silicon hard mask layer is etched to be less than that of the N-doped poly-silicon hard mask layer;
   Step 2: depositing an anti-reflection layer on the N-doped poly-silicon hard mask layer and the undoped poly-silicon hard mask layer with different thicknesses, and etching according to a predetermined pattern until exposing the N-doped poly-silicon, wherein when the N-doped poly-silicon is exposed, the undoped poly-silicon is etched to a certain degree;
   Step 3: removing residuals formed during etching on the surface of the above structure formed by Step 2, and etching the N-doped poly-silicon and undoped poly-silicon to form an N-doped poly-silicon gate and an undoped poly-silicon gate, respectively.

2. The method of claim 1, wherein the thickness difference between the undoped poly-silicon hard mask layer and the N-doped poly-silicon hard mask layer in the Step 1 is related to the etching rate ratio of the hard mask layer and the undoped poly-silicon in the Step 2, as well as the etching rate ratio of the undoped poly-silicon and N-doped poly-silicon in the Step 3.

3. The method of claim 2, wherein the thickness difference between the undoped poly-silicon hard mask layer and the N-doped poly-silicon hard mask layer in the Step 1 is calculated according to the following equation:

$$T_{HM\_Ppoly} = \frac{ER_{HM\_HM}}{ER_{Ppoly\_HM}} \times T_{Ppoly\_etch}$$

where $T_{HM\_Ppoly}$ is the thickness difference between the undoped poly-silicon hard mask layer and the N-doped poly-silicon hard mask layer in the Step 1, $ER_{HM\_HM}$ is the etching rate of the hard mask layer in the Step 2, $ER_{Ppoly\_HM}$ is the etching rate of the undoped poly-silicon in the Step 2, $T_{Ppoly\_etch}$ is the etching thickness of the undoped poly-silicon when the N-doped poly-silicon is exposed in the Step 2, and $T_{Ppoly\_etch}$ is calculated according to the following equation:

$$T_{Ppoly\_etch} = T_{Ppoly\_remain}$$

where $T_{Ppoly\_remain}$ is the remaining thickness of the undoped poly-silicon when the etching of the N-doped poly-silicon gate is complete in the conventional technology, and $T_{Ppoly\_remain}$ is calculated according to the following equation:

$$T_{Ppoly\_remain} = T_{poly} - \frac{ER_{Ppoly\_poly}}{ER_{Npoly\_poly}} \times T_{poly}$$

where $T_{poly}$ is the total thickness of the N-doped and undoped poly-silicon, $ER_{Ppoly\_poly}$ is the etching rate of the undoped poly-silicon, $ER_{Npoly\_poly}$ is the etching rate of the N-doped poly-silicon.

4. The method of claim 1, wherein the etching time for etching the undoped poly-silicon hard mask layer is calculated according to the following equation:

$$Time_{HM\_etch} = \frac{T_{HM\_Ppoly}}{ER_{HM\_HM}}$$

where $Time_{HM\_etch}$ is the etching time for etching the undoped poly-silicon hard mask layer in the Step 1, $ER_{HM\_HM}$ is the etching rate of the hard mask layer in the Step 1, $T_{HM\_Ppoly}$ is the thickness difference between the undoped poly-silicon hard mask layer and the N-doped poly-silicon hard mask layer in the Step 1, and $T_{HM\_Ppoly}$ is calculated according to the following equation:

$$T_{HM\_Ppoly} = \frac{ER_{HM\_HM}}{ER_{Ppoly\_HM}} \times T_{Ppoly\_etch}$$

Where $T_{HM\_Ppoly}$ is the thickness difference between the undoped poly-silicon hard mask layer and the N-doped poly-silicon hard mask layer in the Step 1, $ER_{HM\_HM}$ is the etching rate of the hard mask layer in the Step 2, $ER_{Ppoly\_HM}$ is the etching rate of the undoped poly-silicon in the Step 2, $T_{Ppoly\_etch}$ is the etching thickness of the undoped poly-silicon when the N-doped poly-silicon is exposed in the Step 2, and $T_{Ppoly\_etch}$ is calculated according to the following equation:

$$T_{Ppoly\_etch} = T_{Ppoly\_remain}$$

where $T_{Ppoly\_remain}$ is the remaining thickness of the undoped poly-silicon when the etching of the N-doped poly-silicon gate is complete in the conventional technology, and $T_{Ppoly\_remain}$ is calculated according to the following equation:

$$T_{Ppoly\_remain} = T_{poly} - \frac{ER_{Ppoly\_poly}}{ER_{Npoly\_poly}} \times T_{poly}$$

where $T_{poly}$ is the total thickness of the N-doped and undoped poly-silicon, $ER_{Ppoly\_poly}$ is the etching rate of the undoped poly-silicon, $ER_{Npoly\_poly}$ is the etching rate of the N-doped poly-silicon.

* * * * *